United States Patent [19]

Penney

[11] Patent Number: 4,584,559
[45] Date of Patent: Apr. 22, 1986

[54] DUAL RANK SAMPLE AND HOLD CIRCUIT AND METHOD

[75] Inventor: Bruce J. Penney, Portland, Oreg.

[73] Assignee: Tektronix, Inc., Beaverton, Oreg.

[21] Appl. No.: 620,233

[22] Filed: Jun. 13, 1984

[51] Int. Cl.[4] .............................................. H03K 5/159
[52] U.S. Cl. ................................ 340/347 SH; 307/352
[58] Field of Search .................. 340/347 SH, 347 CC; 307/352, 353; 328/151

[56] References Cited

U.S. PATENT DOCUMENTS 4,302,689  11/1981  Brodie ................................. 307/353
4,348,768   9/1982  Svala .................................. 340/347 C Primary Examiner—L. T. Hix
Assistant Examiner—David M. Gray
Attorney, Agent, or Firm—William A. Birdwell; Francis I. Gray

[57] ABSTRACT

A dual rank sample and hold circuit and method is particularly applicable to deglitching the output of a digital-to-analog converter. One signal path is provided for coupling an input signal to the output of the sample and hold circuit to track the input signal during sampling. A second signal path is provided for coupling the input signal to a storage capacitor for charging or discharging the capacitor to the level of the input signal. In one embodiment the output is coupled simultaneously via the first signal path to the input signal and through a resistor to the storage capacitor, during a sampling phase, the capacitor being coupled to the input signal, and thereafter only to the capacitor during a hold phase, the capacitor being decoupled from the input signal. In another embodiment the output is coupled alternatively through the first signal path to the input signal during a sampling phase, the capacitor being coupled to the input signal, and thereafter to the capacitor during a hold phase, the capacitor being decoupled from the input signal. In application to a digital-to-analog converter sampling begins after the analog output signal settles and ends prior to the next conversion event, and hold lasts past the next conversion event to the next sample.

12 Claims, 5 Drawing Figures

DUAL RANK SAMPLE AND HOLD CIRCUIT AND METHOD

BACKGROUND OF THE INVENTION

This invention relates to circuits and methods for sampling the level of a signal and holding the sampled value constant for a predetermined period of time, and particularly to circuits and methods which provide a high slew rate during sample acquisition and a stable hold output.

Sample and hold circuits typically employ a switching device for periodically connecting a capacitor to an input signal to be sampled so that while the capacitor is connected to the signal it will charge or discharge to the voltage level of the signal, and after the switch is disconnected the capacitor will hold that voltage level. The capacitor is also typically connected to a high impedance input of a buffer amplifier which provides the hold output signal of the sample and hold circuit, the high impedance input ensuring minimal discharge of the capacitor during the hold phase of the circuit's operation.

Where the signal to be sampled is derived from a relatively high impedance source an input amplifier to the sample and hold circuit is also typically employed preceding the switching device to provide a relatively low impedance source of current to the charging capacitor thereby minimizing the time required for the capacitor to charge or discharge from one voltage level to another. Nevertheless, the time required for the capacitor to charge or discharge from one voltage level to another, that is the "acquisition time" of the sample and hold circuit, is limited by, among other things, the finite effective source impedance from which the charging signal is derived. As the frequency of the sample signal and, hence, the sampling rate increase, the acquisition time takes on greater significance.

One of the applications for sample and hold circuits is to eliminate certain defects in the output of a typical digital-to-analog converter ("DAC"). Due to the nature of operation of a DAC and to practical limitations in the construction of a theoretically perfect DAC, the analog output of a DAC typically includes spikes, or "glitches", occurring during conversion events, i.e., the transition of the output from one voltage level to another. Although the high frequency components in the analog output of a DAC resulting from the conversion switching frequency can be eliminated by low pass filtering, the glitches introduce frequency components that often lie within the spectrum of the analog signal to be reconstructed and therefore produce significant distortion in some applications. Consequently it is desirable to eliminate those glitches.

One approach to the elimination of glitches in the output of a DAC is to employ a sample and hold circuit at the output of the DAC, commonly known as a "deglitcher". The output of the DAC settles to within an acceptable accuracy of the new voltage level within a maximum settling time following the beginning of the conversion event. In the use of a sample and hold circuit as a deglitcher the output of the DAC is sampled after the settling time of one event has passed and held until the settling time of the next event has passed, and so on. Thus, the output of the sample and hold circuit is held during the time that the glitches occur, thereby eliminating their effect, though introducing a slight output time delay. An example of a circuit that employs such a method is found in the GVG 3280, Four Channel Audio Multiplex system manufactured and sold by the Grass Valley Group of Tektronix, Inc.

While a deglitcher of the type previously described eliminates the frequency components otherwise introduced by glitches, the resultant signal is still not a perfect "stair-step" output, due to the acquisition time of the sample and hold circuit. Heretofore efforts to increase the slew rate of sample and hold circuits, and thereby decrease acquisition time, have compromised hold stability, and vice versa. This is because, in part, acquisition time increases as the size of the storage capacitor increases and hold stability, or "droop," increases as the size of the storage capacitor decreases. The distortion introduced by aquisition droop is in many cases significant and introduces frequency components that cannot be eliminated by low pass filtering.

Accordingly, it would be desirable to have a sample and hold circuit which minimizes the need to trade off hold stability for high slew rate, and which could be employed to deglitch the output of a DAC while introducing minimal additional distortion.

SUMMARY OF THE INVENTION

The aforementioned drawbacks of prior art sample and hold circuits, particularly as applied to deglitching the output of DACs, have been eliminated by the provision of a dual rank sample and hold circuit and method. That is, a circuit is provided wherein at the start of a sampling period the sample and hold output tracks the sampled input signal in response to that signal via one signal path, while a storage capacitor is charged or discharged to the level of the input signal via another signal path. Once enough time has passed to allow for acquisition of the signal level by the capacitor, the capacitor is disconnected from the input signal and the output is provided in response to the voltage on the storage capacitor.

In application to the deglitching of the output of a DAC, a sampling phase of the sample and hold circuit begins after the settling time of one conversion event and ends prior to the beginning of the next conversion event, and a hold phase of the circuit continues through the next conversion event to the beginning of the next sampling phase. In this way glitches in the DAC output are ignored while introducing very little acquisition or droop distortion.

In one embodiment of the invention switching and timing circuitry is provided so that during a first, sampling phase the input signal to be sampled is coupled to an output amplifier via a first signal path and also coupled to the storage capacitor via a second signal path, the capacitor being coupled to the output amplifier by a resistor. Consequently, the output tracks the input signal while the capacitor charges or discharges to the level of the input signal. Thereafter, during a hold phase, the input signal is decoupled from both the output amplifier and the capacitor so that the output amplifier obtains its only input from the voltage on the storage capacitor. Input buffer amplifiers and single-throw switches are included in both of the signal paths. This embodiment provides the advantages of dramatically increasing slew rate while permitting the use of a capacitor having relatively high capacitance so as to minimize droop distortion, and of permitting relatively large input voltage transitions without increasing acquisition time.

A second embodiment substitutes for the single-throw switch in the first signal path and the resistor coupling the capacitor to the output amplifier, a double-throw switch which alternatively couples the output amplifier either to the input signal or to the storage capacitor. In this embodiment, during the sampling phase the output amplifier is coupled to the input signal and decoupled from the storage capacitor by the double-throw switch, while the storage capacitor is coupled to the input signal by a second switch. During the hold phase the output amplifier is decoupled from the input signal and coupled to the capacitor by the double-throw switch, while the capacitor is decoupled from the input signal by the second switch. This embodiment provides the essential feature of tracking the input signal via one path while the storage capacitor is being charged via another, thereby dramatically increasing slew rate while permitting the use of a storage capacitor having relatively high capacitance, in a simpler and more economic configuration. However, it requires more accurate switch devices to obtain the same accuracy as the first embodiment and therefore is limited in its application by the lack of current availability of highly accurate switches.

Accordingly it is a principal object of the present invention to provide a novel and improved sample and hold circuit and method.

It is another object of the present invention to provide a sample and hold circuit which exhibits both a high signal acquisition slew rate and high hold output stability.

It is a further object of the present invention to provide a sample and hold circuit that is particularly adapted for use in a digital-to-analog conversion system for deglitching the output of a digital-to-analog converter.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
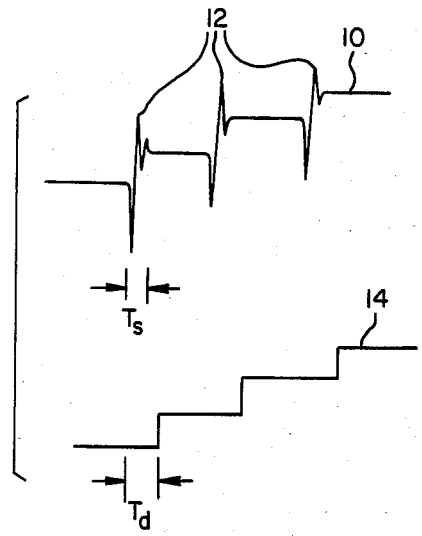
FIG. 1 shows a waveform illustrative of the analog output of a typical DAC, and a waveform illustrative of an idealized deglitched output.

Referring to FIG. 1, a typical DAC waveform 10 includes glitches 12 associated with conversion events. $T_s$ designates a maximum settling time following the beginning of a conversion event by which the glitches have dissipated sufficiently that the analog output voltage is within an acceptable accuracy. Waveform 14 illustrates an idealized output from a sample and hold DAC deglitcher, $T_d$ representing the time delay from the beginning of a conversion event to the beginning of sample acquisition.

Figure 2:
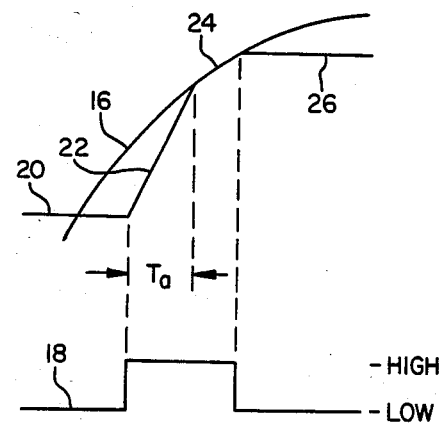
FIG. 2 shows waveforms illustrative of a signal to be sampled, and the resultant sampled signal, in relation to an illustrative sample and hold timing signal.

The effect of acquisition time is shown in FIG. 2. A signal to be sampled is represented by waveform 16, and a logic timing signal controlling sample and hold events is shown by waveform 18. When the timing signal goes "high" sample acquisition begins. When the timing signal goes "low" the hold phase of a typical sample and hold circuit begins. In the sample and hold output signal 20 it can be seen that there is a portion occurring during the acquisition time $T_a$ which does not track the input signal 16. There is a second portion 24, occurring after acquisition, which tracks the input signal, within some degree of accuracy depending upon the rate of change of the input signal, and a third portion 26 which remains at the input signal level at the moment the hold phase begins and typically exhibits some droop. The acquisition portion 22 and droop in the hold portion 26 introduce unwanted distortion which is alleviated by the present invention.

Figure 3:
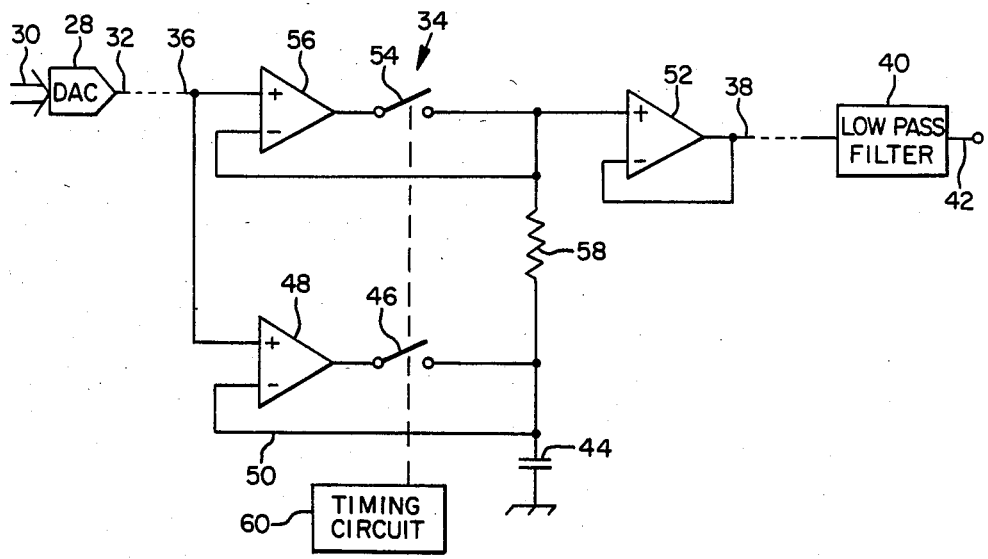
FIG. 3 shows a preferred embodiment of a circuit according to the present invention.

Turning now to FIG. 3, a preferred embodiment of a digital-to-analog conversion system according to the present invention employs a DAC 28, having a digital input 30 and an analog output 32; a preferred embodiment of a sample and hold circuit 34 according to the present invention, having an input 36 for receiving an input signal to be sampled and an output 38 for providing a hold output signal; and a low pass filter 40 connected to the output 38 for providing a filtered signal at an output 42.

In the sample and hold circuit 34 a capacitor 44 is provided for storing a voltage equal to the level of the sampled signal. A single-throw switch 46 is provided for selectively coupling the capacitor 44 to the input signal. Preferably, a buffer amplifier 48 is provided to couple the input signal to the switch 46 to maximize the slew rate of the signal on the capacitor 44, particularly where the source of the input signal exhibits a relatively high source impedance. It is also preferred that the amplifier employ a negative feedback loop 50 derived from the capacitor 44 for maximum sample accuracy. When the switch 46 is closed capacitor 44 charges or discharges to the level of the input signal during an acquisition period whose length is determined primarily by the capacitance of capacitor 44, the change in voltage level of the input signal, and the effective source impedance of the amplifier 48. The switch is maintained closed for a predetermined period of time long enough for the voltage on the capacitor 44 to reach the voltage of the input signal, after which the switch is opened so that the voltage on the capacitor will remain constant.

An output amplifier 52 provides a sample and hold circuit hold output signal at output 38. The input impedance of amplifier 52 must be relatively high in order to minimize droop due to charging or discharging of the capacitor 44 during the hold phase. The input of amplifier 52 is coupled to the input signal by a single-throw switch 54. Preferably, the switch 54 is coupled to the input signal by a buffer amplifier 56, which provides additional current to the storage capacitor 44 during the sampling phase, as explained below, and provides a low source impedance for the input to output amplifier 52. It is also preferred that amplifiers 52 and 56 each have negative feedback loops to maximize accuracy and stability. When switch 54 is closed the hold output 38 tracks the input signal.

The capacitor 44 is connected to the input of output amplifier 52 by a resistor 58. When the switch 54 is closed the amplifier 56 not only drives the input to output amplifier 52, but assists in charging capacitor 44 through resistor 58, thereby decreasing the sample acquisition time. The resistance of resistor 58 is preferably relatively high so as to allow large sample steps with reasonable output drive capabilities in amplifier 56. A timing circuit 60 is provided for opening and closing the switches 46 and 54 at the proper time.

Figure 4:
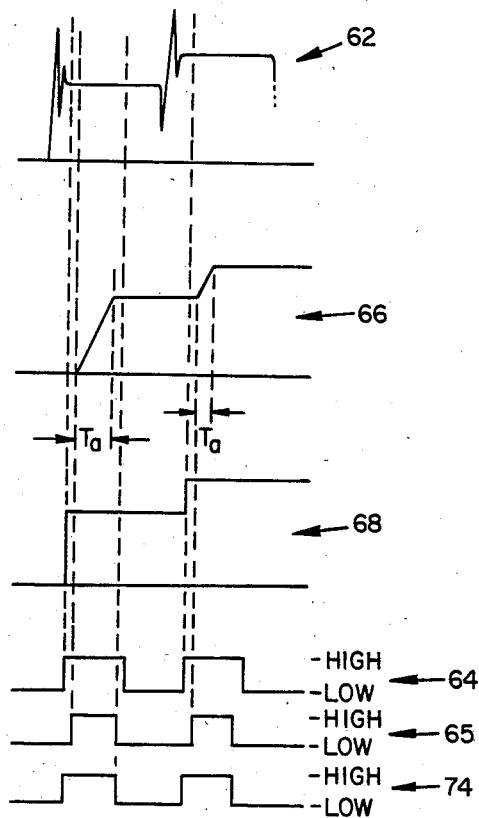
FIG. 4 shows waveforms illustrative of the operation of the circuits shown in FIGS. 3 and 5.

The operation of the sample and hold circuit is best explained, in connection with a digital-to-analog conversion system, with reference to FIG. 4. In that figure the DAC output waveform is shown at 62, and illustrative timing signals are shown at 64 and 65. The timing signal 64 is such that it goes high a predetermined period following the beginning of a conversion event, that period being selected so as to exceed the maximum settling time of the DAC. When the timing signal goes high the switch 54 is closed. This causes buffer amplifier 56 to drive output amplifier 52, and thereby track the input signal at a slew rate limited only by the respective slew rares of the two amplifiers, and simultaneously to charge or discharge the capacitor 44 through the resistor 58. very shortly afterwards, timing signal 65 goes high, closing switch 46 to cause buffer amplifier 48 to charge or discharge the capacitor 44, the two buffer amplifiers combining to increase the slew rate of the signal on capacitor 44. Since the input signal is coupled through amplifiers 56 and 52 to the output 38 the acquisition time Ta of the capacitor 44 does not affect the slew rate of the output signal, provided that the sampling period exceeds the acquisition time. The closing of switch 46 is delayed slightly after the closing of switch 54 to prevent glitches from being produced in the hold output by the sample and hold circuit itself due to imprecise synchronization of the two switches.

After a predetermined sampling time, the timing signals 64 and 65 go low, thereby opening switches 46 and 54. As can be seen in FIG. 4, the sampling period is set so that the switches are opened after acquisition has ended, as shown by the signal 66 on the capacitor 44. By that time the voltage on the capacitor will have reached the input signal voltage. Consequently the output voltage remains constant despite the opening of switch 54, as shown by the output signal 68 in FIG. 4. In the exemplary application to the deglitching of a DAC, it is preferred that switch 46 be opened slightly before switch 54. This allows capacitor 44 to adjust to the output level of buffer amplifier 56, in the event of a slight mismatch between buffer amplifiers 48 and 56, prior to entering the hold phase. It is to be recognized, however, that in other applications this may not be necessary, or even desirable.

In the deglitching of a DAC, sampling begins after the DAC output is settled and continues until after the acquisition period, at which point the hold phase begins and continues through the next conversion event until the next sample. Thus, the circuit eliminates glitches without introducing significant acquisition or droop distortion. While the circuit is particularly applicable to deglitching a DAC output, it is to be recognized that there may be other applications as well.

Figure 5:
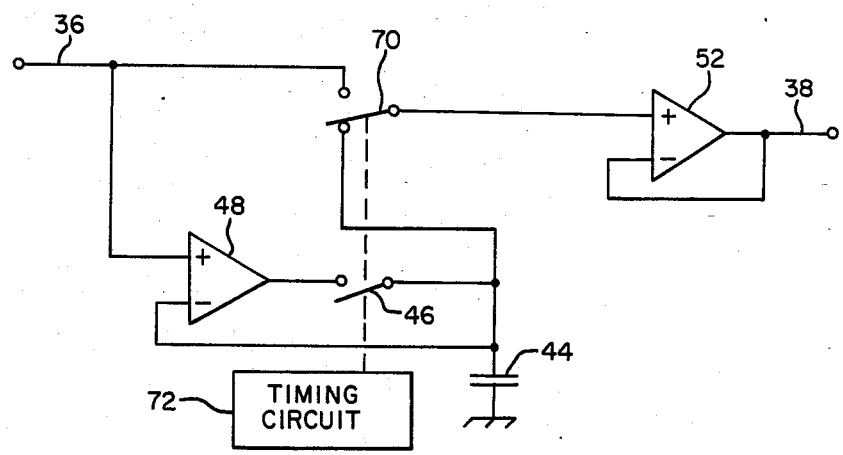
FIG. 5 shows an alternative embodiment of a sample and hold circuit according to the present invention.

Turning now to FIG. 5, which shows an alternative embodiment, buffer amplifier 56, switch 54, and resistor 58 in FIG. 3 have been eliminated and replaced by a double-throw switch 70 and a timing circuit 72 which may be, but is not necessarily, different from timing circuit 60. In this case the switch 70 alternatively selects as an input to the output amplifier 52 the input signal or the signal on the capacitor 44. It selects the input signal while the capacitor 44 is charging, i.e., during the sample phase, and the signal on the capacitor 44 during the hold phase. Thus, as shown in FIG. 4, a timing signal 74 first goes high, causing switch 70 to be connected to the input signal to track the input signal; shortly thereafter timing signal 65 goes high to close switch 46 and charge capacitor 44. After a period allowed for acquisition, timing signal 74 then goes low, causing switch 70 to be connected to the capacitor 44, and timing signal 65 also goes low, causing switch 46 to open while presenting the same voltage level to the output amplifier 52. While in the exemplary application to the deglitching of a DAC switch 70 could be connected to the capacitor after switch 46 is opened, in some applications simultaneous, or other relative, actuation of the switches to enter the hold phase, may be desirable.

While the embodiment of FIG. 5 may be chosen for simplicity and economy in systems, such as video systems, wherein switches with sufficient accuracy to fulfill the task of switch 70 are available, it does not provide the additional advantage of charging the capacitor through two amplifiers, as in the embodiment of FIG. 3. Where high switch accuracy is necessary, as in audio circuits, the embodiment of FIG. 3 is preferred due to the unavailability of accurate switches to fulfill the task of switch 70. It is to be recognized that the switches referred to herein would, in most cases, be electronic switches constructed of semiconductor devices and associated circuitry, though electronically controlled mechanical switches may serve for some applications and are considered within the scope of the invention. It is also to be recognized that other charge storage devices, or an electronic circuit that performs an equivalent function, might be substituted for the conventional capacitor 44 without departing from the principles of the invention. It is further to be recognized that the design of appropriate switches, appropriate timing circuitry, digital-to-analog converters and low pass filters suitable for use with the invention is commonly known in the art.

The terms and expressions which have been employed in the foregoing specification are used therein as terms of description and not of limitation, and there is no intention of the use of such terms and expressions of excluding equivalents of the features shown and described or portions therof, it being recognized that the scope of the invention is defined and limited by the claims which follow.

I claim:
1. A sample and hold circuit comprising:
 (a) storage means for storing a charge representative of a voltage;
 (b) charging means for selectively coupling an input signal along a first signal path to said storage means for a first predetermined period of time so as to supply charge to said storage means; and
 (c) output means for providing an output signal responsive to said input signal along a second signal path for a first portion of a second predetermined period of time and thereafter responsive to said voltage along a third signal path for a second portion of said second period of time.

2. The circuit of claim 1 wherein said output means comprises:
 a first amplifier having a high impedance input and an output;
 a resistor connected between said high impedance input and said storage means forming said third signal path; and tracking means for selectively coupling said high impedance input to said input signal forming said second signal path.

3. The circuit of claim 2 wherein said storage means comprises a capacitor, said charging means comprises a second amplifier having an input responsive to said input signal and an output, and first switch means for selectively coupling said output of said second amplifier to said capacitor, and said tracking means comprises a third amplifier having an input responsive to said input signal and an output, and a second switch means for selectively coupling said output of said third amplifier to said high impedance input.

4. The circuit of claim 3 wherein said output means further comprises timing means for synchronizing said first switch means and said second switch means so as first to couple said output of said third amplifier to said high impedance input and thereafter to couple said output of said second amplifier to said capacitor.

5. The circuit of claim 2 wherein said output means further comprises timing means for synchronizing said charging means and said tracking means so as first to couple said high impedance input to said input signal and thereafter to couple said input signal to said storage means.

6. The circuit of claim 1 wherein said output means comprises a first amplifier having a high impedance input and an output, and selector switch means for selectively coupling said high impedance input either to said input signal during said first portion of said second predetermined period of time or to said storage means during said second portion of said second predetermined period of time.

7. The circuit of claim 6 wherein said storage means comprises a capacitor, said charging means comprises a second amplifier having an input responsive to said input signal and an output, and first switch means for selectively coupling said output of said second amplifier to said capacitor.

8. The circuit of claim 7 wherein said output means further comprises timing means for synchronizing said first switch means with said selector switch means so as first to couple said high impedance input to said input signal and thereafter to couple said output of said second amplifier to said capacitor.

9. The circuit of claim 6 wherein said output means further comprises timing means for synchronizing said charging means and said selector switch means so as first to couple said high impedance input to said input signal and thereafter to couple said input signal to said storage means.

10. The circuit of claim 1 wherein said input signal is provided by the analog output of a digital-to-analog converter having a predetermined maximum settling period following each conversion event, said output means including timing means for starting said first and second time periods after the settling period of one conversion event but before the next conversion event, said second time period lasting past the settling period of said next conversion event and said first portion of said second time period terminating prior to said next conversion event.

11. A sample and hold method comprising the steps of:
(a) charging or discharging a capacitor by an input signal along a first signal path;
(b) while charging or discharging said capacitor in step (a), providing as an output signal said input signal along a second signal path; and
(c) after said capacitor has charged or discharged to a voltage substantially equal to the voltage of said input signal, terminating steps (a) and (b) and providing as said output signal the voltage on said capacitor along a third signal path.

12. A digital-to-analog converter system comprising:
(a) a digital-to-analog converter having an analog output and a predetermined maximum analog output setting period following each conversion event;
(b) storage means for storing a charge representative of sampled voltage;
(c) charging means for selectively coupling said analog output to said storage means along a first signal path for a first time period starting after the settling time of one conversion event, and ending after said sampled voltage has reached the voltage of said analog output but before the next conversion event; and
(d) output means for providing an output signal responsive to said analog output along a second signal path during said first time period and thereafter responsive to said sampled voltage along a third signal path for a second time period lasting past the settling time of said next conversion event.

* * * * *